(12) United States Patent
Sarfert et al.

(10) Patent No.: US 12,345,769 B2
(45) Date of Patent: Jul. 1, 2025

(54) METHOD FOR DETERMINING THE CAPACITY OF AN ELECTRICAL ENERGY STORAGE UNIT

(71) Applicant: Robert Bosch GmbH, Stuttgart (DE)

(72) Inventors: Christel Sarfert, Korntal-Muenchingen (DE); Ganesh Susmitha, Bengaluru (IN); Jens Becker, Benningen Am Neckar (IN); Venkatrao Desai, Kalaburagi (IN)

(73) Assignee: Robert Bosch GmbH, Stuttgart (DE)

( * ) Notice: Subject to any disclaimer, the term of this patent is extended or adjusted under 35 U.S.C. 154(b) by 399 days.

(21) Appl. No.: 17/924,799

(22) PCT Filed: May 11, 2021

(86) PCT No.: PCT/EP2021/062414
§ 371 (c)(1),
(2) Date: Nov. 11, 2022

(87) PCT Pub. No.: WO2021/228809
PCT Pub. Date: Nov. 18, 2021

(65) Prior Publication Data
US 2023/0204673 A1 Jun. 29, 2023

(30) Foreign Application Priority Data
May 13, 2020 (DE) ............. 10 2020 206 014.2

(51) Int. Cl.
*G01R 31/387* (2019.01)
*H02J 7/00* (2006.01)

(52) U.S. Cl.
CPC .......... *G01R 31/387* (2019.01); *H02J 7/0048* (2020.01); *H02J 7/007182* (2020.01)

(58) Field of Classification Search
CPC ...... H02J 7/007182; H02J 7/0048; H02J 7/00; G01R 31/388; G01R 31/387; H01M 10/44; Y02T 10/70; Y02E 60/10
See application file for complete search history.

(56) References Cited

U.S. PATENT DOCUMENTS 6,366,054 B1  4/2002 Hoenig et al.
10,459,038 B2 * 10/2019 Becker .................... G06F 17/18
(Continued)

FOREIGN PATENT DOCUMENTS

DE  102010027857 A1  10/2011
DE  102010027861 A1  10/2011
(Continued)

OTHER PUBLICATIONS

Translation of International Search Report for Application No. PCT/EP2021/062414 dated Aug. 16, 2021 (2 pages).

*Primary Examiner* — An H Do
(74) *Attorney, Agent, or Firm* — Michael Best & Friedrich LLP

(57) ABSTRACT

A method for determining the capacity of an electrical energy storage unit with-in an electrical energy storage system. The system includes a plurality of electrical energy storage units and at least one switching means. The capacity of the electrical energy storage unit is determined from a current flow path of the system in the charging. The electrical energy storage unit is disconnected from the current flow path of the electrical energy storage system and a first voltage value is determined, the electrical energy storage unit is connected into the current flow path and charged and/or discharged, the electrical energy storage unit is disconnected from the current flow path again and a second voltage value is determined, and the capacity of the electri- (Continued)

cal energy storage unit is determined on based on the first voltage value and the second voltage value.

13 Claims, 3 Drawing Sheets

(56) References Cited

U.S. PATENT DOCUMENTS

| | | | |
|---|---|---|---|
| 11,865,925 B2* | 1/2024 | Weber | ................... H02H 7/18 |
| 11,909,211 B2* | 2/2024 | Yergol | ................ G01R 31/367 |
| 2013/0322488 A1 | 12/2013 | Yazami et al. | |

FOREIGN PATENT DOCUMENTS

| | | |
|---|---|---|
| DE | 102014215773 A1 | 2/2016 |
| DE | 102015223580 A1 | 6/2017 |
| DE | 102018212545 A1 | 1/2020 |
| EP | 3726235 A1 | 10/2020 |
| JP | 2011053088 A | 3/2011 |
| JP | 2014220236 A | 11/2014 |
| JP | 5741389 B2 | 7/2015 |

* cited by examiner

Fig. 3
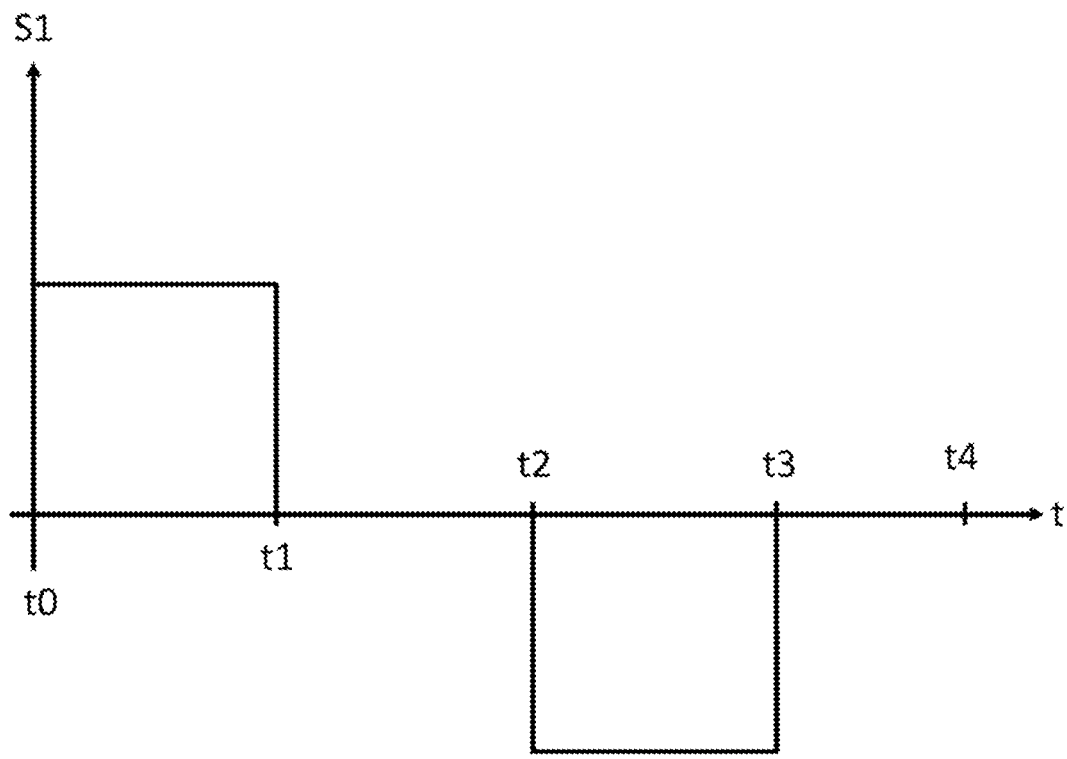
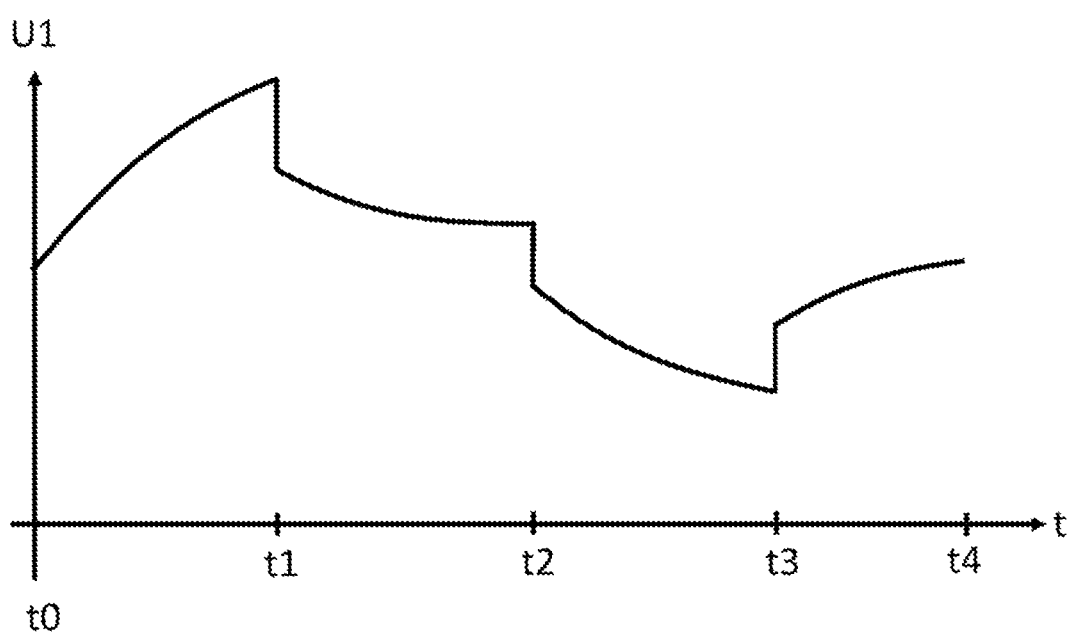

METHOD FOR DETERMINING THE CAPACITY OF AN ELECTRICAL ENERGY STORAGE UNIT

BACKGROUND OF THE INVENTION

The present disclosure is based on a method for determining the capacity of an electrical energy storage unit.

As a consequence of the increasing electrification, in particular in the vehicle or automotive sector, increasingly mobile electrical energy storage systems are used. In particular in the case of the increasingly used lithium-ion technology, the maintenance of preset limit values, for example voltage and state-of-charge limit values, is required in order to ensure the safety and life of the electrical energy storage system. Furthermore, in particular for users of these electrical energy storage systems, an accurate knowledge of the capacity, i.e. the storage capability, of the electrical energy storage units of the corresponding electrical energy storage system is relevant. For this purpose, corresponding updates of the capacity values of the electrical energy storage units are performed by a battery management system usually at irregular intervals. By means of these capacity values, for example, a remaining residual range of an electric vehicle can be indicated to a user. The more often these updates can be performed, the more accurately the vehicle range can be indicated to the user.

SUMMARY OF THE INVENTION

What is disclosed is: a method for determining the capacity of an electrical energy storage unit having the features of the independent patent claim. In this case, the electrical energy storage unit is part of an electrical energy storage system comprising a plurality of electrical energy storage units, wherein the electrical energy storage system has at least one switching means, which is designed to switch the electrical energy storage unit whose capacity is being determined electrically out of a current flow path of the electrical energy storage system in the charging and/or discharging direction and/or to switch said electrical energy storage unit electrically into the current flow path in the charging and/or discharging direction. In this case, the capacity denotes here, for example, the present quantity of electrical charge which can be stored as a maximum in the electrical energy storage unit under permissible operating conditions. This can be reduced, for example, by aging effects. The at least one switching means can be in the form of a full bridge or in the form of a half bridge, for example. Such embodiments are known, for example, from the earlier applications DE 10 2010 027857 and DE 10 2010 027861.

Within the method, the electrical energy storage unit is switched out of the current flow path of the electrical energy storage system in the charging and/or discharging direction by means of the switching means in order to make it possible for the electrical energy storage unit to be brought close to a steady state or quasi-steady state since, in this case, a particularly accurate determination of a voltage value of the no-load voltage of the electrical energy storage unit is possible.

Furthermore, a first voltage value of a terminal voltage of the electrical energy storage unit is determined. The fact that this takes place in a disconnected or switched-out state is advantageous since, as mentioned, in this case a voltage value of the no-load voltage of the electrical energy storage unit can be determined in a simple and accurate manner.

Furthermore, the electrical energy storage unit is switched into the current flow path of the electrical energy storage system in the charging and/or discharging direction by means of the switching means in order that it can be charged or discharged again.

Furthermore, the electrical energy storage unit is charged and/or discharged with a predefined first quantity of charge and/or up to a predefined first state of charge and/or up to a predefined first voltage level. Advantageously, it then has a different state of charge and/or a different voltage level than previously.

The electrical energy storage unit is switched out of the current flow path of the electrical energy storage system again in the charging and/or discharging direction by means of the switching means in order to again achieve, where possible, a steady state/quasi-steady state.

A determination of a second voltage value of the electrical energy storage unit takes place, from which a voltage value of the no-load voltage of the electrical energy storage unit can be determined again, as described above, in a simple and accurate manner.

Finally, the capacity of the electrical energy storage unit is determined at least in dependence on the first voltage value and the second voltage value.

The method is advantageous since the switching-out of the electrical energy storage unit enables an accurate and flexible determination of the capacity of the electrical energy storage unit, which enables a safe and reliable operation of the electrical energy storage system.

The method can be computer-implemented, for example.

Further advantageous embodiments of the present invention are the subject matter of the dependent claims.

Expediently, the first voltage values are determined after a predefined first wait time and/or when a predefined first rate of change of the terminal voltage has been reached. In this case, in particular it is advantageous if a rate of change, in terms of absolute value, is undershot since it can be concluded from this that corresponding physical and/or chemical equalization processes in the electrical energy storage unit come close to a steady state. This is advantageous since the value of the terminal voltage can therefore be assumed, with sufficient accuracy, to be the value of the no-load voltage without additional calculations needing to be carried out. The wait time can in this case be dependent on the type of electrical energy storage unit and should therefore be selected depending on the application. The predefined rate of change can also be determined, for example, experimentally or in model-based fashion in the preliminary stages of the application in order to achieve a predefined accuracy of the no-load voltage value determined from the terminal voltage value.

Expediently, the second voltage value is determined after a predefined second wait time and/or when a predefined second rate of change of the terminal voltage has been reached. In this case, it is advantageous in particular if a rate of change, in terms of absolute value, is undershot since it can be concluded from this that corresponding physical and/or chemical equalization processes in the electrical energy storage unit come close to a steady state. This is advantageous since the value of the terminal voltage can therefore be assumed, with sufficient accuracy, to be the value of the no-load voltage without additional calculations needing to be carried out. The wait time can in this case be dependent on the type of electrical energy storage unit and should therefore be selected depending on the application. The predefined rate of change can also be determined, for example, experimentally or in model-based fashion in the preliminary stages of the application in order to achieve a predefined accuracy of the no-load voltage value determined from the terminal voltage value.

Expediently, the steps of switching-out, determination of the voltage values, switching-in, charging and/or discharging, as have been described above, are performed repeatedly, and thus more than two voltage values of the terminal voltage are determined. This is advantageous in order to determine a multiplicity of voltage values and thus to increase the accuracy of the capacity determination.

Expediently, the capacity is determined by adaptation of a preset no-load voltage curve in dependence on the determined voltage values. This is advantageous since the form of the no-load voltage curve does not usually change in shape depending on the type of electrical energy storage unit but is compressed, for example. This can be extended to the extent that different characteristics are provided for different electrodes or electrode materials which, when, when overlaid, result in the no-load voltage characteristic. For example, in the case of a lithium-ion battery cell, an anode characteristic for the anode potential against lithium and a cathode characteristic for the cathode potential against lithium can be provided which, when overlaid or when the difference is formed, result in the no-load voltage characteristic. Correspondingly, the two characteristics are then adapted in order to produce a no-load voltage characteristic which reflects the determined voltage values as accurately as possible. Therefore, in an advantageous manner, capacity effects can also be determined separately according to anode and cathode.

Expediently, in each case the state of charge of the electrical energy storage unit is determined from the determined voltage values. This is advantageous in order to calculate from this, by forming the difference and corresponding conversion, a quantity-of-charge difference which can be used in the determination of the capacity.

Furthermore, the subject matter of the disclosure is a computer program which is designed to implement all of the steps in the disclosed method. Therefore, the mentioned advantages can be realized.

Furthermore, the subject matter of the disclosure is a machine-readable storage medium on which the computer program is stored. Therefore, the computer program can be distributed and implemented easily.

Furthermore, the subject matter of the disclosure is an apparatus for determining the capacity of an electrical energy storage unit within an electrical energy storage system comprising a plurality of electrical energy storage units, wherein the electrical energy storage system has at least one switching means, which is designed to switch the at least one electrical energy storage unit whose capacity is being determined electrically out of a current flow path of the electrical energy storage system in the charging and/or discharging direction and/or to switch said at least one electrical energy storage unit electrically into the current flow path in the charging and/or discharging direction, comprising at least one means, in particular an electronic control unit, which is designed to implement all of the steps in the method. This is advantageous since a simple use of the method is enabled. The at least one means can comprise, for example, a battery management control device or an electronic control unit. An electronic control unit can be understood to mean in particular an electronic control device which comprises, for example, a microcontroller and/or an application-specific hardware module, for example an ASIC, but likewise a personal computer or a programmable logic controller can fall under this category.

Furthermore, the subject matter of the disclosure is an electrical energy storage system, which comprises a plurality of electrical energy storage units and the disclosed apparatus. In this case, the electrical energy storage system has at least one switching means, which is designed to switch the at least one electrical energy storage unit whose capacity is being determined electrically out of a current flow path of the electrical energy storage system in the charging and/or discharging direction and/or to switch said at least one electrical energy storage unit electrically into the current flow path in the charging and/or discharging direction.

An electrical energy storage unit can in particular be understood to mean an electrochemical battery cell and/or a battery module having at least one electrochemical battery cell and/or a battery pack having at least one battery module. For example, the electrical energy storage unit can be a lithium-based battery cell or a lithium-based battery module or a lithium-based battery pack. In particular, the electrical energy storage unit can be a lithium-ion battery cell or a lithium-ion battery module or a lithium-ion battery pack. Furthermore, the battery cell can be of the type lithium-polymer rechargeable battery, nickel-metal hydride rechargeable battery, lead-acid rechargeable battery, lithium-air rechargeable battery or lithium-sulfur rechargeable battery or quite generally a rechargeable battery having any desired electrochemical composition.

BRIEF DESCRIPTION OF THE DRAWINGS

Advantageous embodiments of the invention are illustrated in the figures and explained in more detail in the description below.

In the drawings:

FIG. 3 shows a schematic voltage waveform of an electrical energy storage unit whose capacity is being determined in accordance with the disclosed method.

DETAILED DESCRIPTION

Identical reference symbols in all of the figures denote identical apparatus components or identical method steps.

Figure 1:
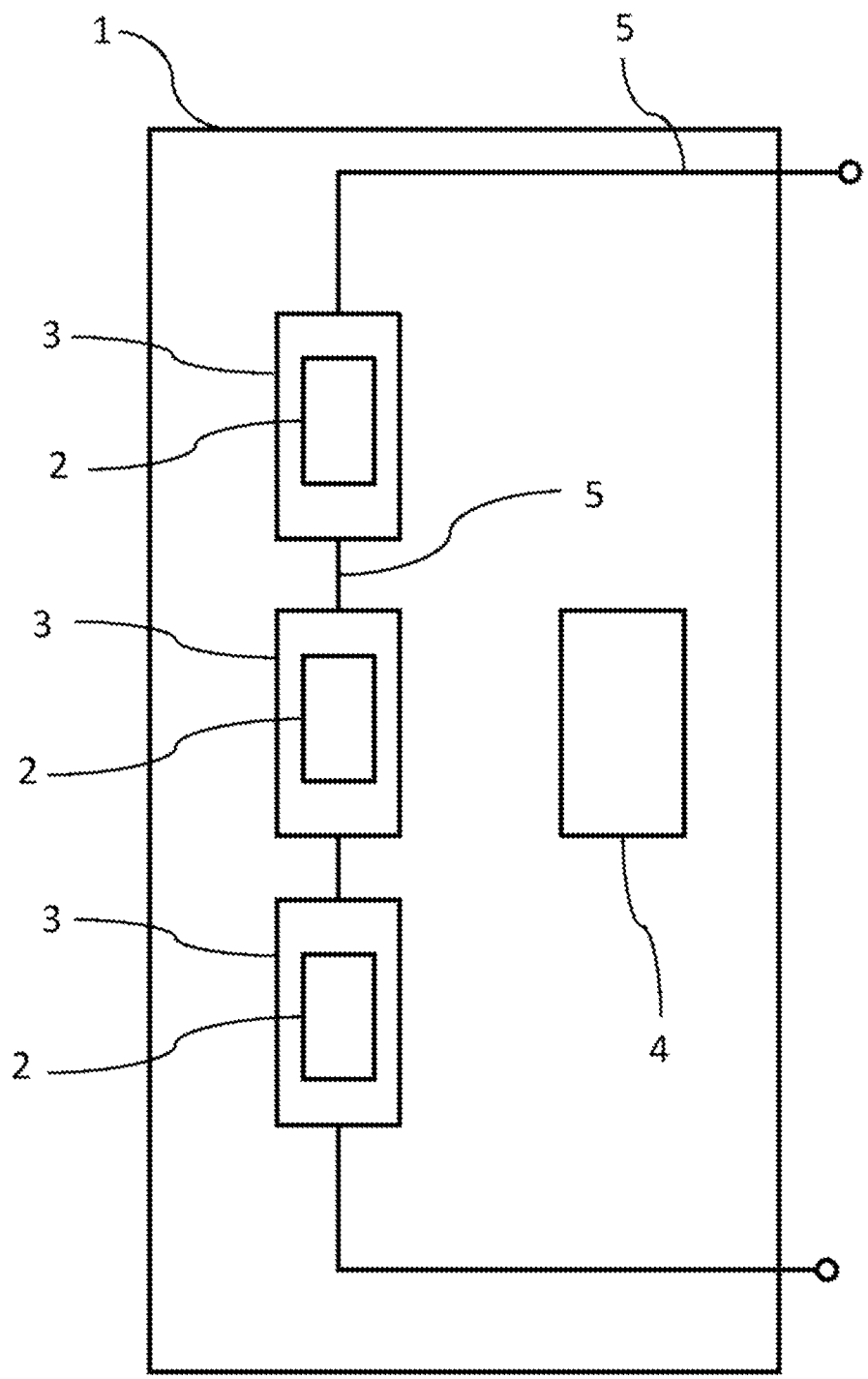
FIG. 1 shows an electrical energy storage system having a plurality of electrical energy storage units, having a corresponding switching means, in accordance with one embodiment.

FIG. 1 shows an electrical energy storage system 1 comprising a plurality of electrical energy storage units 2 and in each case one associated switching means 3, which is designed to switch the electrical energy storage unit 2 whose capacity is being determined electrically out of a current flow path 5 of the electrical energy storage system 1 in the charging and/or discharging direction and/or to switch said electrical energy storage unit 2 electrically into the current flow path 5 in the charging and/or discharging direction.

Furthermore, the electrical energy storage system 1 has an apparatus 4 for determining the capacity of an electrical energy storage unit 2, as has been disclosed above. In this case, the apparatus 4 comprises an electronic control unit, which is not illustrated explicitly here. The electronic control unit is in this case designed to implement the above-described method.

The apparatus 4 is in this case designed to determine the corresponding voltage values by means of suitable connections. They are not illustrated explicitly here, but can be, for example, cable-based or cable-free connections. Corresponding voltage sensors are in this case fitted to the electrical energy storage units 2.

Figure 2:
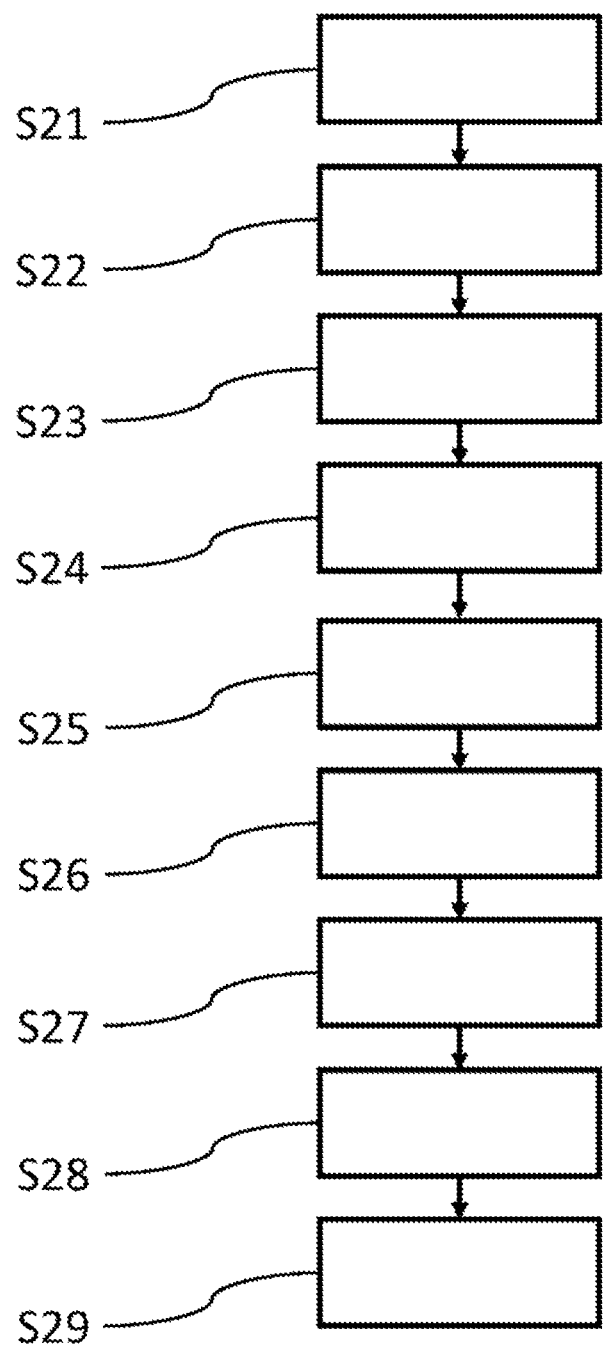
FIG. 2 shows a flowchart of the disclosed method in accordance with one embodiment.

FIG. 2 shows a flowchart of the disclosed method in accordance with one embodiment. The at least one electrical energy storage unit whose capacity is being determined is in this case arranged within an electrical energy storage system having a plurality of electrical energy storage units, as is illustrated, by way of example, in FIG. 1. In this case, the electrical energy storage system has at least one switching means, which is designed to switch the at least one electrical energy storage unit whose capacity is being determined electrically out of a current flow path of the electrical energy storage system in the charging and/or discharging direction and/or to switch said at least one electrical energy storage unit electrically into the current flow path in the charging and/or discharging direction.

- In a first step S21, the electrical energy storage unit whose capacity is being determined is switched into the current flow path of the electrical energy storage system in the charging direction by means of the switching means. It can thus be charged but not discharged.
- In a second step S22, the electrical energy storage unit is charged up to a predefined first voltage level. The first voltage level is preferably over 3.6 volts.
- In a third step S23, the electrical energy storage unit is switched out of the current flow path of the electrical energy storage system in the charging direction by means of the switching means. Since it was only previously switched in in the charging direction, it is therefore isolated from the current flow path of the electrical energy storage system.
- In a fourth step S24, a first voltage value of a terminal voltage of the electrical energy storage unit is determined. Preferably, this is performed after a predefined first wait time.
- In a fifth step S25, the electrical energy storage unit is switched into the current flow path of the electrical energy storage system in the discharging direction by means of the switching means, with the result that discharge is possible.
- In a sixth step S26, the electrical energy storage unit is discharged up to a predefined second voltage level, with the result that a predefined voltage difference is present between the two voltage levels.
- In a seventh step S27, the electrical energy storage unit is switched out again, this time in the discharging direction out of the current flow path. Therefore, it is isolated from the current flow path of the electrical energy storage system.
- In an eighth step S28, a second voltage value of a terminal voltage of the electrical energy storage unit is determined. Preferably, this is performed after a predefined second wait time.
- In a ninth step S29, finally the capacity of the electrical energy storage unit is determined depending on the first voltage value and the second voltage value.

FIG. 3 shows a schematic voltage waveform of an electrical energy storage unit whose capacity is being determined in accordance with the disclosed method. In this case, the graph at the top indicates a switching position S1 of the switching means described, for example, in FIG. 1, i.e. whether the electrical energy storage unit has been switched into or out of a current flow path of an electrical energy storage system in the charging or discharging direction.

From a time t0 to a time t1, the electrical energy storage unit is switched into the current flow path of the electrical energy storage system by means of the switching means in the charging direction and is charged corresponding to the graph at the bottom, which indicates the terminal voltage U1 of the electrical energy storage unit. The charging takes place up to a time t1, at which a predefined first voltage level is reached.

At time t1, the electrical energy storage unit is switched out of the current flow of the electrical energy storage system; it can therefore be neither charged nor discharged. As can be seen from the graph at the bottom, the terminal voltage comes asymptotically close to a quiescent value, the no-load voltage value. Preferably, a first voltage value is determined at time t2, shortly before the electrical energy storage unit is switched into the current flow path of the electrical energy system in the discharging direction, with the result that discharge is possible.

From a time t2 to a time t3, the electrical energy storage unit is switched into the current flow path of the electrical energy storage system by means of the switching means in the discharging direction and is discharged corresponding to the graph at the bottom, which indicates the terminal voltage U1 of the electrical energy storage unit. The discharge takes place up to a time t3, at which a predefined first voltage level is reached.

At time t3, the electrical energy storage unit is switched out of the current flow of the electrical energy storage system; it can therefore neither be charged nor discharged. As can be seen from the graph at the bottom, the terminal voltage comes asymptotically close to a quiescent value, the no-load voltage value. Preferably, a second voltage value is determined at time t4, shortly before the electrical energy storage unit is switched back into the current flow path of the electrical energy storage system in the discharging direction. The capacity of the electrical energy storage unit can then be determined from the determined voltage values.

The invention claimed is:

1. A method for determining the capacity of an electrical energy storage unit (2) within an electrical energy storage system (1) that includes a plurality of electrical energy storage units (2), a sensor, and at least one switch (3), which is designed to switch the electrical energy storage unit (2) whose capacity is being determined electrically out of a current flow path (5) of the electrical energy storage system (1) and/or to switch said electrical energy storage unit (2) electrically into the current flow path (5), wherein the sensor is configured to detect a voltage of the electrical energy storage unit (2), said method comprising the following steps:
   a) switching, by the switch (3), the electrical energy storage unit (2) out of the current flow path (5) of the electrical energy storage system (1);
   b) determining, by the sensor, a first voltage value of a terminal voltage of the electrical energy storage unit (2);
   c) switching, by the switch (3), the electrical energy storage unit (2) into the current flow path (5) of the electrical energy storage system (1);
   d) charging and/or discharging the electrical energy storage unit (2) with a predefined first quantity of charge and/or up to a predefined first state of charge and/or up to a predefined first voltage level;
   e) switching, by the switch (3), the electrical energy storage unit (2) out of the current flow path (5) of the electrical energy storage system (1) again
   f) determining, by the sensor, a second voltage value of the terminal voltage of the electrical energy storage unit (2); and g) determining, by an electronic control unit, the capacity of the electrical energy storage unit (2) in dependence on the first voltage value and the second voltage value.

2. The method as claimed in claim 1, wherein the determination of the first voltage value in step b) takes place after a predefined first wait time and/or when a predefined first rate of change of the terminal voltage has been reached.

3. The method as claimed in claim 1, wherein the determination of the second voltage value in step f) takes place after a predefined second wait time and/or when a predefined second rate of change of the terminal voltage has been reached.

4. The method as claimed in claim 1, wherein steps a) to f) are performed repeatedly, and more than two voltage values of the terminal voltage are determined.

5. The method as claimed in claim 1, wherein the determination of the capacity in step g) takes place by adaptation of a preset no-load voltage curve in dependence on the determined voltage values.

6. The method as claimed in claim 1, wherein in each case the state of charge of the electrical energy storage unit (2) is determined from the determined voltage values.

7. A computer program, which is designed to implement all of the steps in the method as claimed in claim 1.

8. A machine-readable storage medium on which the computer program as claimed in claim 7 is stored.

9. An apparatus (4) for determining the capacity of an electrical energy storage unit (2) within an electrical energy storage system (1) comprising a plurality of electrical energy storage units (2) and a sensor, wherein the electrical energy storage system (1) has at least one switch (3), which is designed to switch the electrical energy storage unit (2) whose capacity is being determined electrically out of a current flow path (5) of the electrical energy storage system (1) and/or to switch said electrical energy storage unit (2) electrically into the current flow path (5), wherein the sensor is configured to detect a voltage of the electrical energy storage unit (2), comprising electronic control unit configured to switch, using the switch (3), the electrical energy storage unit (2) out of the current flow path (5) of the electrical energy storage system (1);

determine, using the sensor, a first voltage value of a terminal voltage of the electrical energy storage unit (2);

switch, using the switch (3), the electrical energy storage unit (2) into the current flow path (5) of the electrical energy storage system (1);

control charging and/or discharging of the electrical energy storage unit (2) with a predefined first quantity of charge and/or up to a predefined first state of charge and/or up to a predefined first voltage level;

switch, using the switch (3), the electrical energy storage unit (2) out of the current flow path (5) of the electrical energy storage system (1) again;

determine, using the sensor, a second voltage value of the terminal voltage of the electrical energy storage unit (2); and determine the capacity of the electrical energy storage unit (2) in dependence on the first voltage value and the second voltage value.

10. An electrical energy storage system (1) comprising:
a plurality of electrical energy storage units (2);
a sensor is configured to detect a voltage of each of the plurality of electrical energy storage units;
at least one switch (3), which is configured to switch at least one electrical energy storage unit (2) whose capacity is being determined electrically out of a current flow path (5) of the electrical energy storage system (1) and/or to switch said at least one electrical energy storage unit (2) electrically into the current flow path (5); and electronic control unit configured to
switch, using the switch, the electrical energy storage unit (2) out of the current flow path (5) of the electrical energy storage system (1) by means of the switching means (3);
determine, using the sensor, a first voltage value of a terminal voltage of the electrical energy storage unit (2);
switch, using the switch, the electrical energy storage unit (2) into the current flow path (5) of the electrical energy storage system (1);
control charging and/or discharging of the electrical energy storage unit (2) with a predefined first quantity of charge and/or up to a predefined first state of charge and/or up to a predefined first voltage level;
switch, using the switch, the electrical energy storage unit (2) out of the current flow path (5) of the electrical energy storage system (1) again;
determine, using the sensor, a second voltage value of the terminal voltage of the electrical energy storage unit (2); and
determine the capacity of the electrical energy storage unit (2) in dependence on the first voltage value and the second voltage value.

11. The method as claimed in claim 1, wherein the determination of the first voltage value in step b) takes place after a predefined first wait time and/or when a predefined first rate of change of the terminal voltage has been reached, wherein the determination of the second voltage value in step f) takes place after a predefined second wait time and/or when a predefined second rate of change of the terminal voltage has been reached, wherein the determination of the capacity in step g) takes place by adaptation of a preset no-load voltage curve in dependence on the determined voltage values.

12. The method as claimed in claim 1, wherein the sensor is connected to the electrical energy storage unit (2) and the sensor is configured to determine a voltage for the electrical energy storage unit (2).

13. The method as claimed in claim 1, wherein the switch (3) is at least one selected from the group consisting of: a full bridge switch and a half bridge switch.

* * * * *